United States Patent
Nakashima

[11] Patent Number: 5,811,871
[45] Date of Patent: Sep. 22, 1998

[54] SEMICONDUCTOR DEVICE COMPRISING A BIPOLAR TRANSISTOR

[75] Inventor: Takashi Nakashima, Hyogo, Japan

[73] Assignee: Mitsubishi Denki Kabushiki Kaisha, Tokyo, Japan

[21] Appl. No.: 788,801

[22] Filed: Jan. 23, 1997

[30] Foreign Application Priority Data

Sep. 19, 1996 [JP] Japan ................................ 8-248105

[51] Int. Cl.$^6$ ................................ H01L 27/082
[52] U.S. Cl. .................... 257/565; 257/357; 257/360; 257/402; 257/900
[58] Field of Search .................... 257/357, 360, 257/368, 402, 408, 336, 344, 900, 565

[56] References Cited

U.S. PATENT DOCUMENTS 5,534,723  7/1996  Iwai et al. ................................ 257/360
5,741,083  11/1995  Ikeda et al. .

FOREIGN PATENT DOCUMENTS

| 2-102541 | 4/1990 | Japan . |
| 4-372164 | 12/1992 | Japan . |
| 6-97297 | 4/1994 | Japan . |
| 6-36415 | 5/1994 | Japan . |

*Primary Examiner*—Carl W. Whitehead, Jr.
*Attorney, Agent, or Firm*—McDermott, Will & Emery

[57] ABSTRACT

An bipolar transistor of BiCMOS is provided to improve the breakdown voltage between a collector and a base. A low concentration diffusion layer is provided at a main surface of a semiconductor substrate at a boundary between an outer perimeter of an external base layer and an end portion of a field oxide film. The low concentration diffusion layer expands from the main surface of the semiconductor substrate toward the inside of the substrate and has a concentration lower than the impurity concentration of the external base layer.

8 Claims, 28 Drawing Sheets

NPN BIPOLAR

NPN BIPOLAR    PMOS

NPN BIPOLAR · PMOS

NPN BIPOLAR

NPN BIPOLAR

30 : CONVENTIONAL PROFILE
52 : PROFILE OF THE
   PRESENT EMBODIMENT
NPN BIPOLAR

SEMICONDUCTOR DEVICE COMPRISING A BIPOLAR TRANSISTOR

BACKGROUND OF THE INVENTION

1. Field of the Invention

The present invention generally relates to a semiconductor device. It particularly relates to a semiconductor device including a bipolar transistor. The present invention also relates to a method of manufacturing such a semiconductor device.

2. Description of the Background Art

For micro-fabrication and high performance of bipolar transistors, a technique is commonly used in which polysilicon is used for a base lead-out electrode and the diffusion layers for the base and emitter are determined by self-alignment ("polysilicon self-alignment technique").

FIG. 27 is a cross sectional view of a conventional BiCMOS for using the technique mentioned above, in which NPN bipolar, NMOS and PMOS transistors are mounted on the same integrated circuit.

FIG. 28 is a plan view of a portion of the NPN bipolar transistor shown in FIG. 27. FIG. 29 is an enlarged view of a portion of the NPN bipolar transistor shown in FIG. 27.

A manufacturing process of the BiCMOS shown in FIG. 7 and the configuration thereof will now be described in detail.

Referring to FIG. 30, an N type buried layer 2 into which antimony, arsenic or the like is injected and a P type buried layer 3 into which boron or the like is injected are formed in order on surfaces of a P⁻ type substrate 1. Then, referring to FIG. 31, an N type epitaxial growth layer 4 is deposited on semiconductor substrate 1. When the N type epitaxial growth layer 4 is deposited, the impurities in N type buried layer 2 and P type buried layer 3 diffuse into epitaxial growth layer 4.

Referring to FIG. 32, a thermal oxide film 5 is formed on epitaxial growth layer 4. Impurity ions are injected via thermal oxide film 5 to form a P type diffusion layer 6 which serves as both a P type well of the NMOS transistor and a P type isolation of the NPN bipolar transistor.

Referring to FIG. 33, a pattern 7 of nitride film for forming a film oxide film is formed on thermal oxide film 5. Then a P type impurity is injected to form a channel cut layer 8.

Referring to FIG. 33 and 34, a field oxide film 9 is formed by thermal oxidation. Then pattern 7 of nitride film is removed.

Referring to FIG. 35, a nitride film 10 is deposited. A diffusion window 11 for forming an N type diffusion layer 12 for a collector is opened in nitride film 10. Using nitride film 10 as a mask, an N type impurity such as phosphorus is introduced through gas diffusion via diffusion window 11 to form N type diffusion layer 12.

Referring to FIG. 36, a nitride film 10 on the region in which an NPN bipolar transistor is to be formed is removed and then the oxide film 5 lying on the base region is removed to expose a surface 14 of epitaxial growth layer 4. A polysilicon layer 15 to which no impurity is added, and then a CVD oxide film 16 are deposited and then patterned so that they remain at the base region. A CVD oxide film is deposited on a surface of the semiconductor substrate and the entire surface of the CVD oxide film is anisotropically etched to form a sidewall spacer 17 at a periphery of polysilicon layer 15. The remaining nitride film 10 and thermal oxide film 5 are removed. When the films 10 and 5 are removed, the thicknesses of CVD oxide films 16 and 17 and thermal oxide film 13 are reduced.

Then gate oxidation is performed to form thermal oxide films 18 and 19 on surfaces of epitaxial growth layer 4 and P well 6. A polysilicon layer 21 to which an N type impurity such as phosphorus is added, and then a metal film 22 of MoSi, WSi or the like are deposited and patterned into a shape of a gate electrode of a MOS transistor. In the patterning (etching) of the films, the thickness of the CVD oxide film 20 lying on polysilicon layer 15 is reduced. An N type impurity such as phosphorus is ion-implanted using photoresist (not shown) as a mask to form an N type source/drain region 23 for an NMOS transistor.

Referring to FIG. 38, after a CVD oxide film is deposited, its entire surface is anisotropically etched to form a sidewall spacer 24. When the entire surface of the CVD oxide film is anisotropically etched, thermal oxide films 18, 19 and 20 are removed. An N type impurity such as arsenic is ion-implanted using photoresist as a mask, to form an N⁺ source/drain region 25 for an NMOS transistor.

Referring to FIG. 39, sacrificial oxidation is performed to form oxide films 26, 27 and 28. Photoresist is used as a mask and a p type impurity such as boron is ion-implanted into polysilicon layer 15 for an external base and into a PMOS region to form a P⁺ source/drain region 29 and an external base layer 30. The junction depth of external base layer 30 is smaller than that of P⁺ source/drain region 29 due to the ion-implantation via polysilicon layer 15.

Referring to FIG. 40, a CVD oxide film 31 is deposited and etched to expose an intrinsic base region 32. When polysilicon layer 15 is overetched, a surface of epitaxial growth layer 4 is scraped and a step 33 results. A P type impurity such as boron, BF₂ or the like is ion-implanted to form an intrinsic base layer 34.

Referring to FIG. 41, a CVD oxide film 35 is deposited and then its entire surface is etched to form a sidewall spacer 35 at an internal wall of polysilicon layer 15 for the external base. When the entire surface of CVD oxide film 35 is etched, a surface of epitaxial growth layer 4 is scraped off by overetching and a step 36 results.

Referring to FIG. 42, a polysilicon layer 37 is deposited and an N type impurity such as arsenic is ion-implanted into layer 37. Then polysilicon layer 37 is patterned as shown in the figure so that it covers an emitter region. Then, a CVD oxide film 39 is deposited and is subject to heat treatment to form an emitter layer 38. An opening 40 is formed in CVD oxide film 39 to form a contact.

Referring to FIG. 43, metal is deposited filling opening 40 (FIG. 42) so that it is in contact with polysilicon layer 37, and the metal is patterned to form a metal interconnection 41.

A conventional BiCMOS thus configured has the problem described below.

That is, referring to FIG. 29, external base layer 30 is formed by diffusing boron from polysilicon layer 15 for the external base into epitaxial growth layer 4 for the purpose of reducing the depth of junction with epitaxial growth layer 4. Thus, external base layer 30 has the junction depth reduced at an edge of field oxide film 9. This is because the diffusion of boron is suppressed due to a portion referred to as a bird's beak (the circled portion in FIG. 29) at the edge of field oxide film 9. When reverse bias is applied to a collector and a base of an NPN bipolar transistor with junction depth reduced at an edge of a field oxide film, electric field concentration is caused at the circled portion and hence the breakdown voltage between the collector and the base is lowered, since the radius of curvature of the PN junction at this portion is small.

SUMMARY OF THE INVENTION

The present invention is made to solve the problem mentioned above and lies in improving a semiconductor memory device including a bipolar transistor to relax electric field concentration in an external base layer at an edge portion of a field oxide film.

Another object of the present invention is to provide a bipolar transistor improved to desirably increase the breakdown voltage between a collector and a base.

Another object of the present invention is to provide a BiCMOS FET improved to desirably increase the breakdown voltage between a collector and a base.

Still another object of the present invention is to provide a method of manufacturing such a semiconductor device.

A semiconductor device according to a first aspect of the present invention includes a semiconductor substrate. A field oxide film an end of which surrounds an active region to separate the active region from another active region, is provided at a main surface of the semiconductor substrate. An emitter layer is provided at a surface of the active region. A base layer is provided at a surface of the active region such that the base layer surrounds the emitter layer. The semiconductor device includes an external base layer provided at a surface of the active region and surrounding the periphery of the base layer, the external base layer having an inner wall electrically connected to the base layer, and having an outer wall in contact with the end portion of the field oxide film. The device further includes a low concentration impurity diffusion layer provided at a main surface of the semiconductor substrate at a boundary between the external wall of the external base layer and the end portion of the field oxide film and expanding from the main surface of the semiconductor substrate to the inside of the semiconductor substrate, the low concentration impurity diffusion layer having a concentration lower than that of the impurity in the external base layer.

According to another embodiment of the present invention, the low concentration impurity diffusion layer wraps the external base layer.

According to still another embodiment of the present invention, an electric filed effect transistor of LDD structure, which has a high concentration source/drain region and a low concentration source/drain region, is provided at the active region. The low concentration impurity diffusion layer has the same conductivity type and substantially the same impurity concentration as the low concentration source/drain region.

According to still another embodiment, that end portion of the low concentration source/drain region which is closer to the channel share a surface with a sidewalls of the gate electrode of the electric field effect transistor.

Furthermore, that end portion of the low concentration source/drain region which closer to the channel may be spaced apart from the gate electrode.

According to still another embodiment, a sidewall spacer containing an impurity the conductivity type of which is the same as that of the low concentration impurity diffusion layer, is provided at a sidewall of the end portion of the field oxide film.

According to another embodiment, an external base electrode is provided on the semiconductor substrate, the external base electrode being in contact with the external base layer and surrounding the base layer. A metal electrode is provided on said external base electrode such that the metal electrode surrounds the base layer.

Furthermore, according to still another embodiment, a channel cut layer is provided exactly under the field oxide film. The low concentration impurity diffusion layer has the same conductivity type and substantially the same impurity concentration as the channel cut layer.

A semiconductor device according to a second aspect of the present invention includes a semiconductor substrate. A field oxide film an end of which surrounds an active region to isolate the active region from another active region, is provided at a main surface of the semiconductor substrate. An emitter layer is provided at a surface of the active region. A base layer is provided at a surface of the active region such that the base layer surrounds the emitter layer. The semiconductor device includes an external base layer at a surface of the active region such that the external base layer surrounds a periphery of the base layer, an inner wall of the external base layer being electrically connected to the base layer, an outer wall of the external base layer being in contact with the end portion of the field oxide film. The end portion of the field oxide film has a surface scraped downward to form a step.

A method of manufacturing a semiconductor device according to a third aspect of the present invention relates to that of manufacturing a semiconductor device including a bipolar transistor having an emitter layer, a base layer wrapping the emitter layer, an external base layer surrounding a periphery of the base layer, and a collector layer. A field oxide film an end portion of which surrounds an active region is formed at a main surface of a semiconductor substrate. The collector layer is formed at a main surface of the semiconductor substrate. A low concentration impurity layer the impurity concentration of which is lower than that of the external base layer is formed at a surface of said active region. The external base layer, the base layer and the emitter layer are formed in the active region.

Another embodiment of the present invention includes a field effect transistor of LDD structure having a low concentration source/drain layer and a high concentration source/drain layer. Ion implantation for forming the low concentration impurity diffusion layer also serves as ion implantation for forming the low concentration source/drain layer for the field effect transistor of LDD structure.

According to another embodiment of the present invention, impurity ion implantation for forming the low concentration source/drain layer for the field effect transistor of LDD structure is performed prior to the formation of a sidewall spacer at a sidewall of the gate electrode of the field effect transistor.

According to still another embodiment of the present invention, impurity ion implantation for forming the low concentration source/drain layer for the field effect transistor of LDD structure is performed after the formation of a sidewall spacer at a sidewall of the gate electrode of the field effect transistor.

According to still another embodiment of the present invention, the low concentration impurity diffusion layer is formed only near the end of the field oxide film.

According to still another embodiment of the present invention, a step for forming the low concentration impurity diffusion layer includes the step of forming a sidewall spacer containing impurity at a sidewall of the end of the field oxide film and the step of diffusing the impurity contained in the sidewall spacer into a surface of the semiconductor substrate.

A method of manufacturing a semiconductor device according to a fourth aspect of the present invention relates to that of manufacturing a semiconductor device including a bipolar transistor having an emitter layer, a base layer wrapping the emitter layer, an external base layer surrounding a periphery of the base layer, and a collector layer. A field oxide film an end of which surrounds an active region is formed at a main surface of a semiconductor substrate. The collector layer is formed at a main surface of the semiconductor substrate. A portion of the surface of the end of the field oxide film is scraped off along a circumference of the active region. The external base layer, the base layer and the emitter layer are formed.

In a method of manufacturing a semiconductor device according to a fifth aspect of the present invention, a field oxide film, an emitter layer, a base layer wrapping the emitter layer, an external base layer surrounding a periphery of the base layer, and a collector layer are formed at a surface of a semiconductor substrate. An external base electrode in contact with the external base layer is formed on the semiconductor substrate, a portion of the external base electrode extending on the field oxide film. Impurity ions of a concentration lower than that of an impurity in the external base layer and of the same conductivity type as that of the external base layer are selectively injected along a boundary between the external base layer and the field oxide film through the external base electrode.

In a method of manufacturing a semiconductor device according to a sixth aspect of the present invention, a channel cut layer is first formed at a region at which a field oxide film for separating an active region from another active region is to be formed, and simultaneously a low concentration impurity diffusion layer of the same impurity concentration as that of the channel cut layer is formed at a boundary between the active region and the region at which the field oxide film is to be formed. The field oxide film is formed. A bipolar transistor having an emitter layer, a base layer wrapping the emitter layer, an external base layer surrounding the base layer, and a collector layer are formed at the active region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
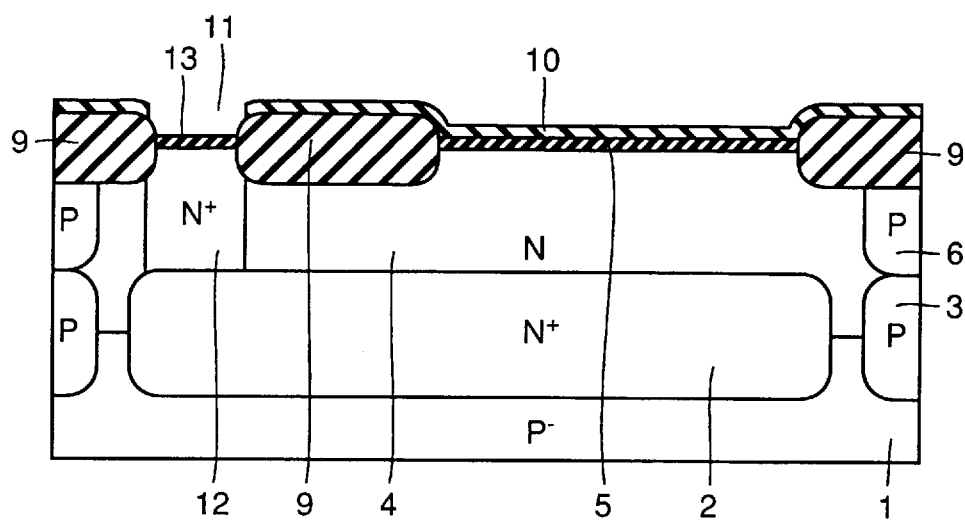
FIGS. 1–4 are cross sectional views of a semiconductor device in the first to fourth steps of a method of manufacturing the semiconductor device according to a first embodiment of the present invention, respectively.

Referring to FIG. 1, an N type buried layer 2, an epitaxial growth layer 4, a field oxide film 9 and a nitride film 10 are formed at a P$^-$ type semiconductor substrate 1, as described in the conventional example. A diffusion window 11 is then formed at nitride film 10. Then, an N type diffusion layer 12 for a collector is formed. Nitride film 10 is then removed.

Figure 2:
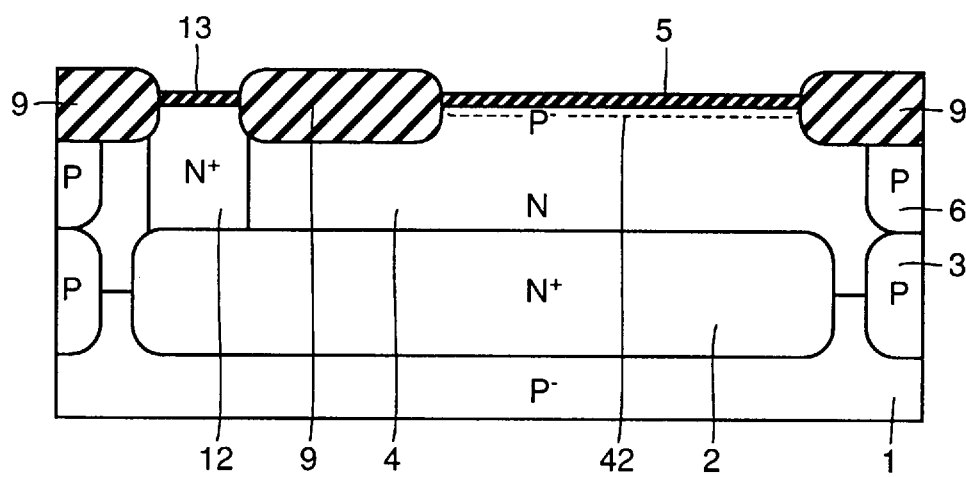

Referring to FIG. 2, ions of a p type impurity such as boron are implanted into a base region through an oxide film 5 to form a P$^-$ layer 42. The amount of impurity ions implanted preferably ranges from $10^{11}$ to $10^{14}$ cm$^{-2}$.

Figure 3:
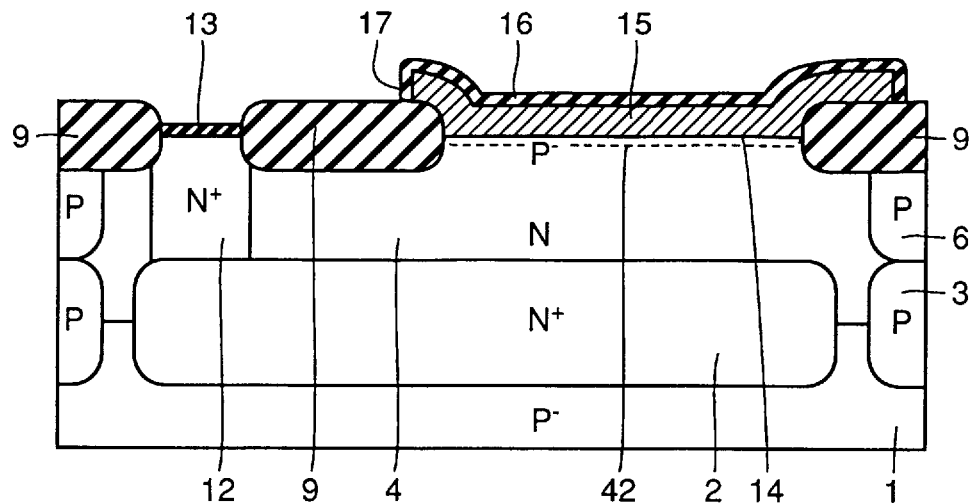

Referring to FIG. 3, a polysilicon layer 15 to which no impurity is added, and a CVD oxide film 16 are deposited and then patterned so that layer 15 and film 16 remain on the base region. Then, a CVD oxide film 17 is deposited and its entire surface is anisotropically etched so that CVD oxide film 17 remains only at a periphery of polysilicon layer 15 as a sidewall spacer 17.

Figure 4:
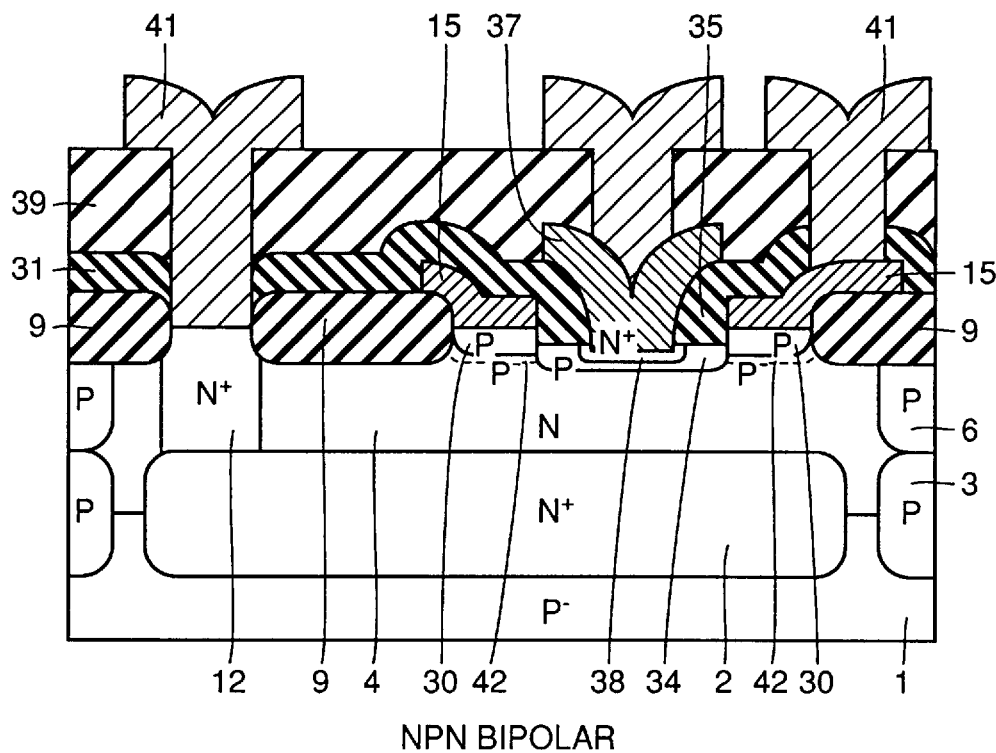

Then steps similar to those of the conventional example (FIGS. 37–43) are performed and the semiconductor device shown in FIG. 4 is obtained. Since an impurity for P$^-$ layer 42 is introduced prior to introduction of an impurity for a P layer 30, the impurity for P$^-$ layer 42 is subject to more heat treatment for thermal oxidation, deposition for forming CVD films or the like and diffuses more deeply. According to the first embodiment, the PN junction disposed at an edge of field oxide film 9 has its radius of curvature increased due to the presence of P$^-$ layer 42 and the concentration gradient of the P type semiconductor is relaxed, so that the electric field strength when a same voltage is applied to between the collector and the base is reduced as compared with an conventional example. This improves the breakdown voltage between the collector and the base.

[Second Embodiment]

Figure 5:
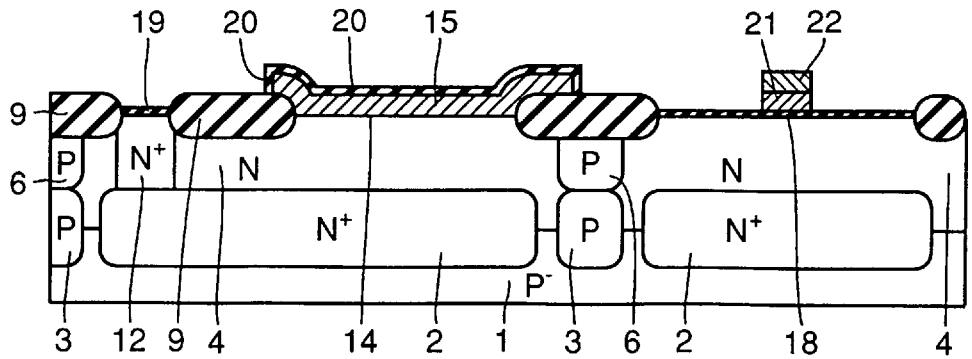
FIGS. 5–8 are cross sectional views of a semiconductor device in the first to fourth steps of a method of manufacturing the semiconductor device according to a second embodiment of the present invention, respectively.
Figure 37:
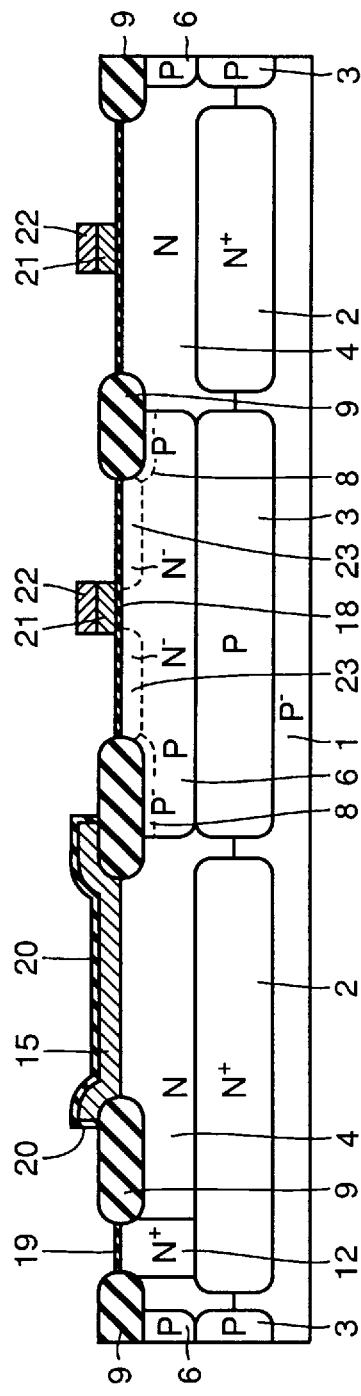
Figure 38:
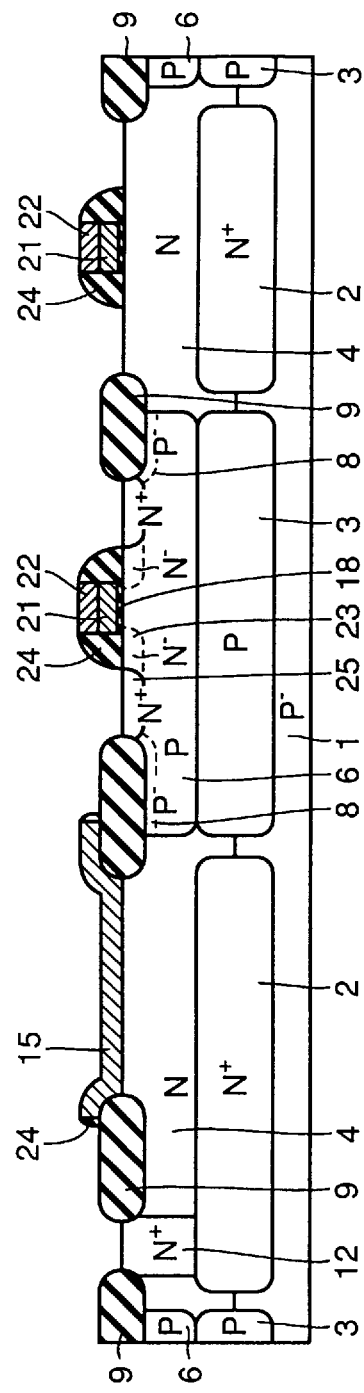

FIG. 5 corresponds to FIG. 37, which shows one step of a conventional method of manufacturing a semiconductor device.

Figure 6:
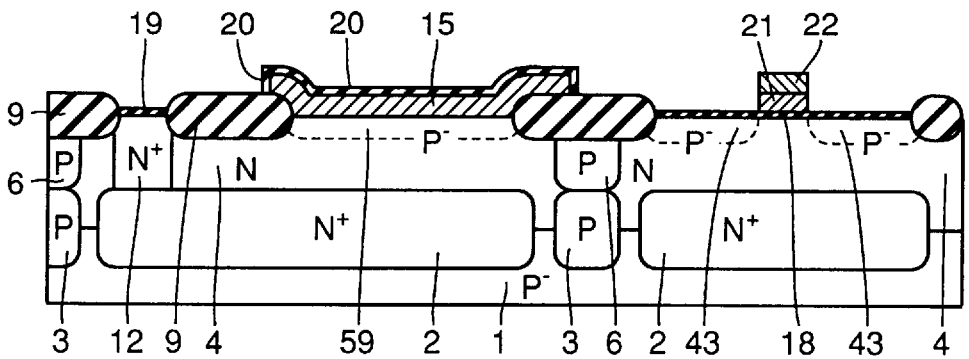

Referring to FIG. 6, photoresist (not shown) is used as a mask and boron ions, BF$_2$ ions or the like are implanted into only a base region of an NPN transistor, a source/drain region of a PMOS transistor and other regions as required. The implantation acceleration voltage is larger than that for the ion implantation for forming P layers 29 and 30 in the subsequent steps, being 10 to 100 keV. The amounts implanted is preferably $10^{12}$ to $10^{15}$ cm$^{-2}$. This ion implantation allows the formation of P⁻ layers 59 and 43.

Figure 7:
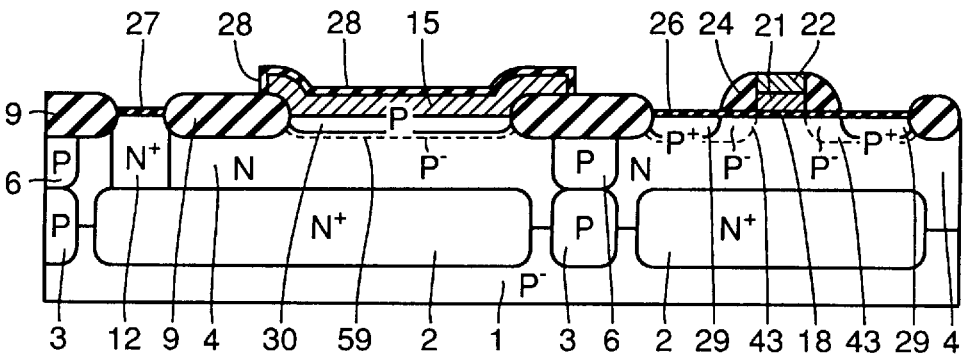

Referring to FIG. 7, a CVD oxide film 24 is deposited. Then, its entire surface is anisotropically etched to form sidewall spacers at a sidewall of a gate electrode 21, 22 and at a sidewall of polysilicon layer 15 for the external base. When the sidewall spacers are formed, thermal oxide films 18 and 19 are removed. Furthermore, thermal oxide film 20 disposed on polysilicon layer 15 for the external base is removed, except for its sidewall portion. In order to repair the damage due to the formation of the sidewalls, sacrificial oxidation is performed to form oxide films 26, 27 and 28. Photoresist (not shown) is used as a mask and boron ions, BF$_2$ ions or the like are implanted into only the base region of an NPN transistor, the source/drain region of the PMOS transistor and other regions as required with a lower acceleration voltage and a larger amount of ions implanted than those with which P⁻ layers 59 and 43 are formed, and P layers 30 and 29 are thus formed.

Figure 8:
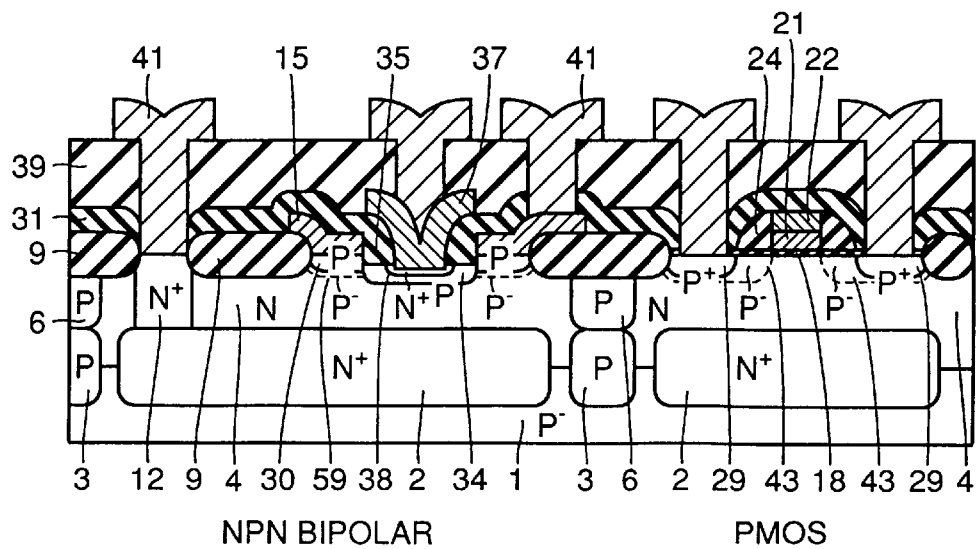

Then, steps similar to those for the conventional example (FIGS. 40–43) are performed to obtain the semiconductor device shown in FIG. 8.

According to the present embodiment, P⁻ source/drain diffusion layer 43 is formed in order to improve the driving capability of the PMOS transistor. P⁻ layer 59 is formed simultaneously with the formation of P⁻ source/drain diffusion layer 43 for the purpose of relaxing electric field concentration in external base layer 30 for the NPN transistor at an edge portion of field oxide film 9.

That is, P⁻ layer 59 formed by diffusion simultaneously with the formation of P⁻ source/drain diffusion layer 43 for the PMOS transistor is formed deeper than P layer 30 which serves as a conventional external base diffusion layer. In this example, P⁻ source/drain region 43 expands exactly under sidewall spacer 24.

P⁻ layer 59 is provided for increasing the radius of curvature of a PN junction in external base layer 30 near an end portion of field oxide film 9, reducing the concentration gradient of the P type impurity diffusion, and improving the breakdown voltage between the collector and the base as compared with the conventional example in an NPN bipolar transistor, as with the first embodiment. Furthermore, P⁻ layer 43 is simultaneously formed in the same method, so that the gate length of the PMOS transistor can be reduced as compared with the conventional example and the driving capability can be enhanced. According to the present embodiment, P⁻ layers 43 and 59 can be simultaneously formed by the same method so that the process can be simplified.

[Third Embodiment]

Figure 9:
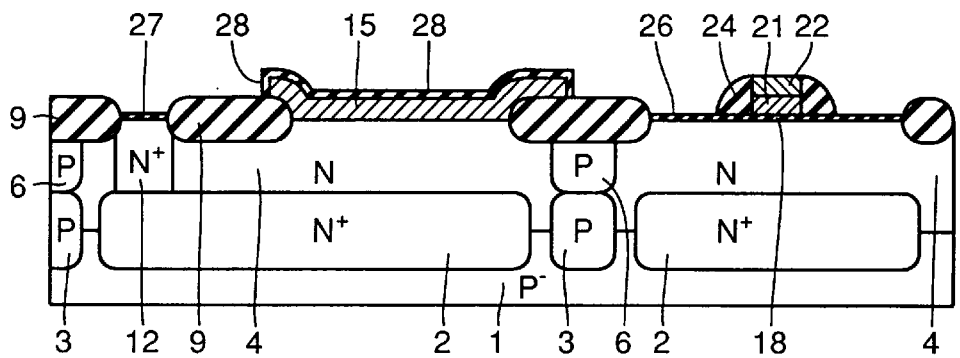
FIGS. 9–11 are cross sectional views of a semiconductor device in the first to third steps of a method of manufacturing the semiconductor device according to a third embodiment of the present invention, respectively.
Figure 10:
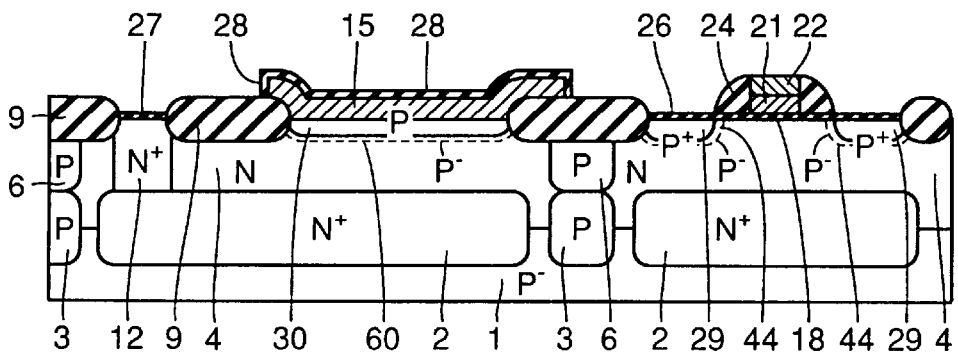
Figure 11:
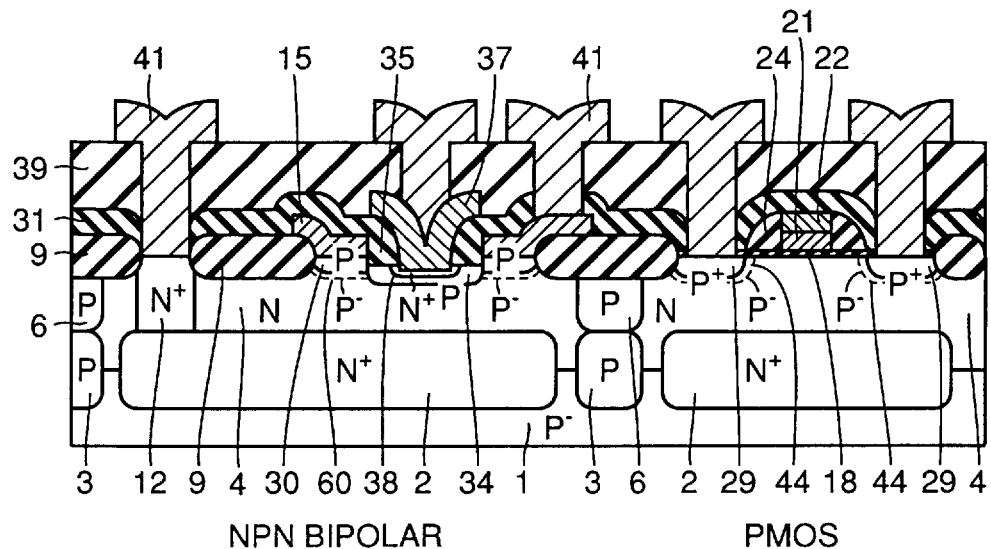

While P⁻ layers 43 and 59 are provided prior to the formation of the sidewall spacers in the second embodiment, the present embodiment is characterized in that the P⁻ layers are formed after formation of a sidewall spacer (FIGS. 9–11).

Figure 27:
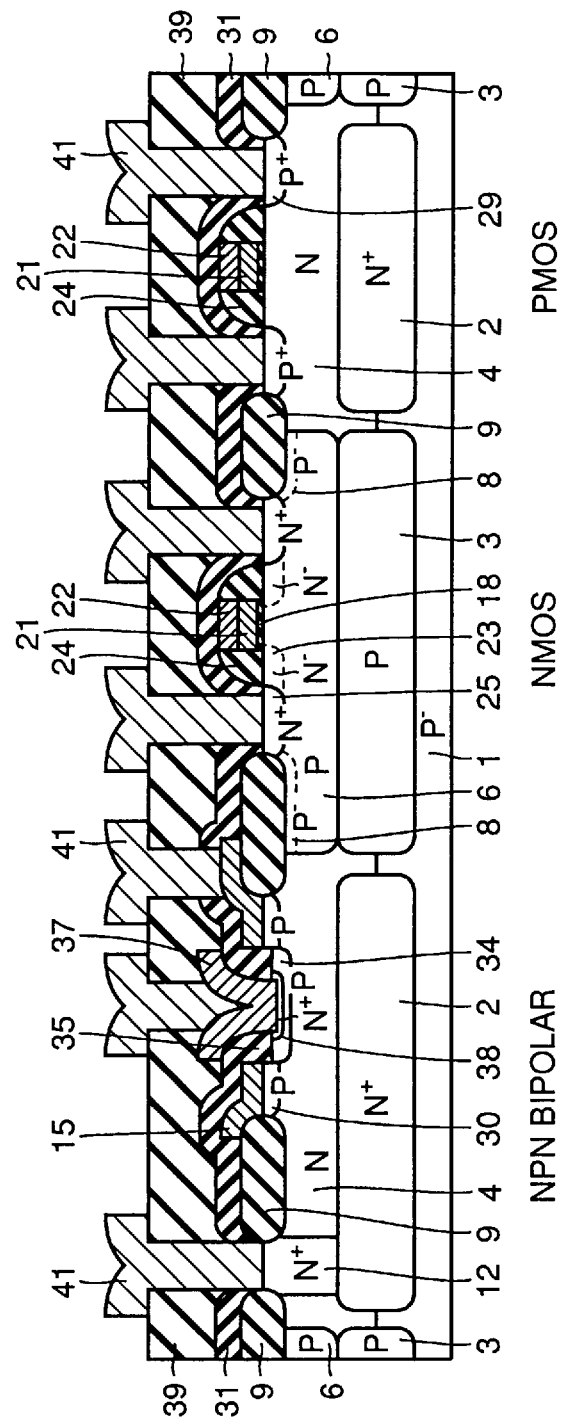
FIG. 27 is a cross sectional view of a conventional BiCMOS.
Figure 28:
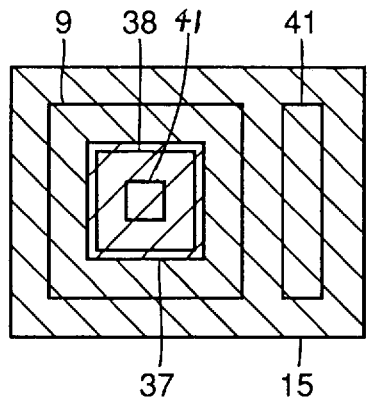
FIG. 28 is a plan view of a portion of a bipolar transistor of the BiCMOS shown in FIG. 27.
Figure 29:
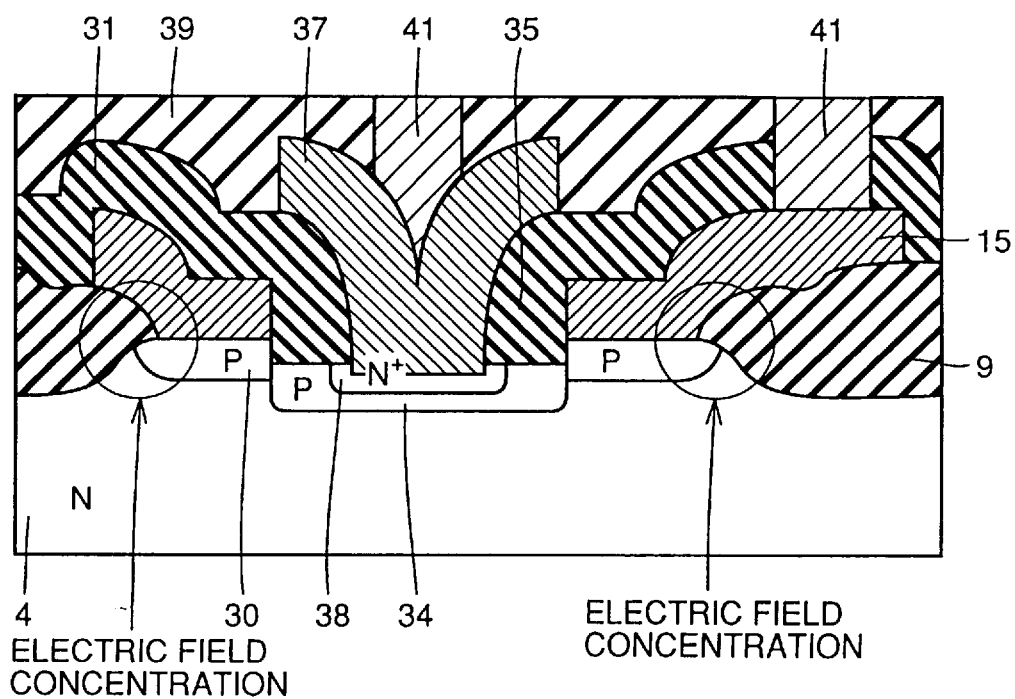
FIG. 29 is an enlarged view of a portion of a bipolar transistor of the BiCMOS shown in FIG. 27.

Referring to FIG. 11, the function of a P⁻ layer 60 in an NPN transistor is the same as that of P⁻ layer 59 in the second embodiment. The function of a P⁻ layer 44 in a PMOS transistor is also the same as that of P⁻ layer 43 in the second embodiment. However, since P⁻ layer 44 is formed after formation of sidewall 24, the effective gate length is increased as compared with the second embodiment. Since boron, which has a large diffusion coefficient, is used as the impurity for the source/drain region in conventional PMOS transistors, it expands due to heat treatment in the subsequent steps and the distance between the source and the drain is so reduced that the breakdown voltage between the source and the drain is often undesirably decreased. For this reason, referring to FIG. 27, a P⁺ source/drain region 29 is formed after formation of a N⁺ source/drain region 25 and the gate length of a PMOS transistor is substantially increased by the width of sidewall spacer 24 to solve the problem. However, PMOS transistors, carriers for which are holes, have smaller driving capability. In order to overcome this problem, P⁻ source/drain region 59 which has a lower concentration than P⁺ source/drain region 29 and is provided at such a position that the gate length of the PMOS transistor is substantially reduced is used as shown in FIG. 8 in the second embodiment, since unnecessary diffusion of P⁻ source/drain region 59 does not expand due to its relatively low concentration and this prevents undesirably decreased breakdown voltage between the source and the drain.

As fine-patterning is advanced, however, diffusion of even P⁻ source/drain region 59 excessively expands. For this region, in the present embodiment, sidewall 24 is first formed and P⁻ source/drain region 44 is then provided, as shown in FIG. 11. It has a lower concentration and diffuses more deeply than P⁺ source/drain region 29 so that the effective gate length can be reduced (see FIG. 11).

Now, a method of manufacturing the semiconductor device will be described.

Figure 39:
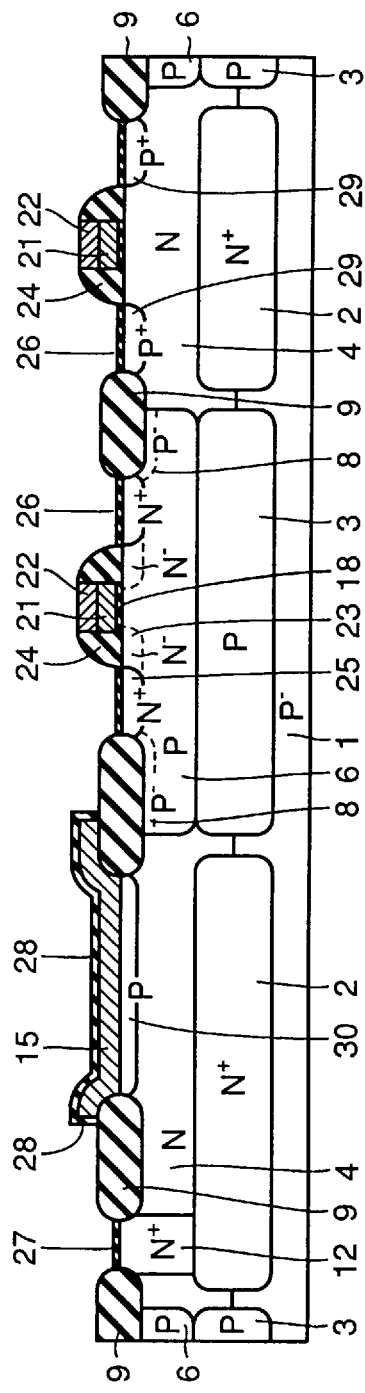
Figure 40:
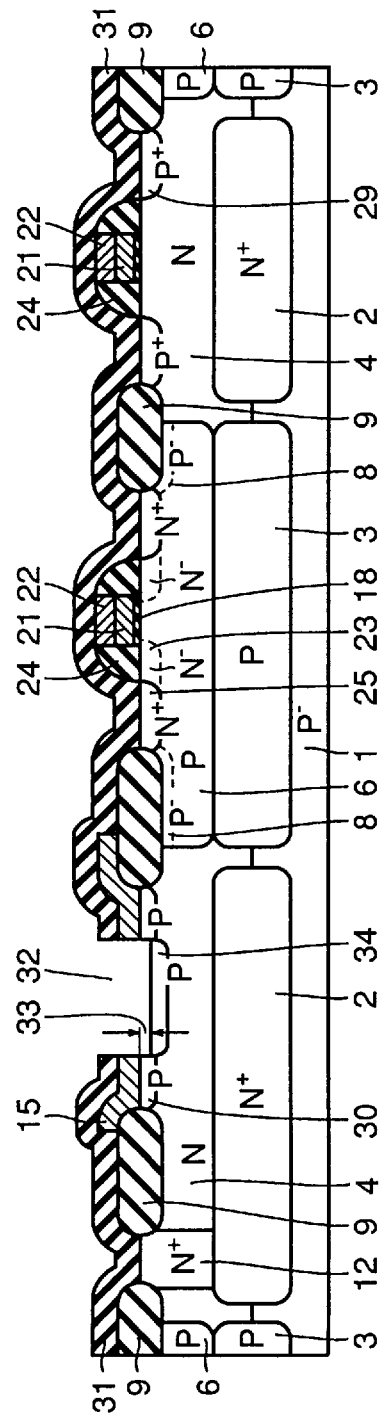
Figure 41:
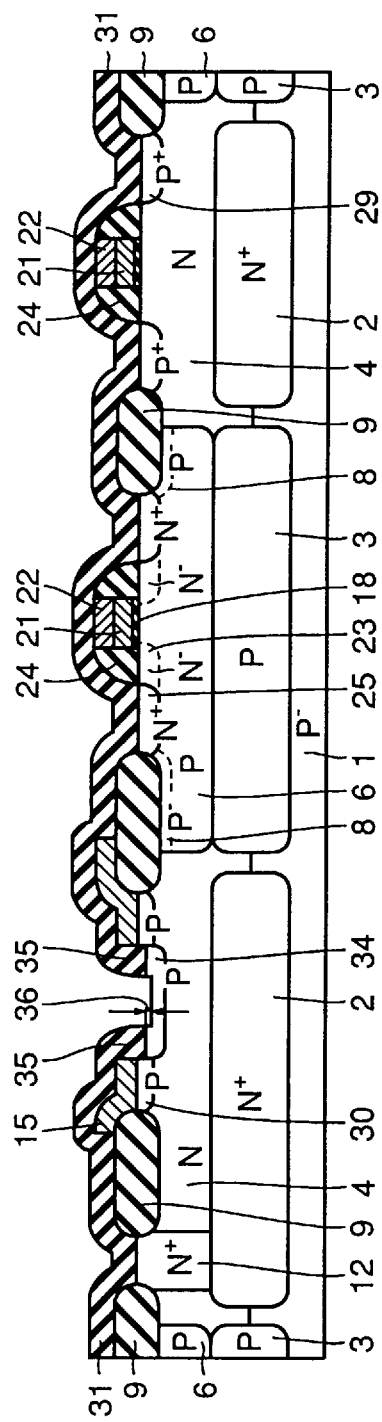

FIG. 9 shows the portion of the NPN transistor and PMOS transistor shown in FIG. 39.

Photoresist (not shown) is used as a mask and boron ions, BF$_2$ or the like are implanted into only a base region of the NPN transistor, a source/drain region of the PMOS transistor and other regions as required. Typically, the ions are implanted at an incident angle of approximately seven degrees with respect to a line perpendicular to substrate 1. However, the ions may be implanted at an incident angle of as great as 45 degrees while the entire substrate pivots horizontally. This allows P⁻ layer 44 to expand under sidewall 24. A preferable range of the acceleration voltage when the ions are implanted and a preferable range of the amount of ions implanted are similar to those in the second embodiment. After the formation of P⁻ layers 60 and 44, ions of a P type impurity are further implanted to form P layers 30 and 29. Acceleration voltage is smaller and the amount of ions implanted is larger in forming P layers 30 and 29 than in forming P⁻ layers 60 and 44. Then the photoresist is removed to obtain what is shown in FIG. 10.

Then, steps similar to conventional steps shown in FIG. 40–43 are performed to obtain the semiconductor device shown in FIG. 11.

[Fourth Embodiment]

Figure 12:
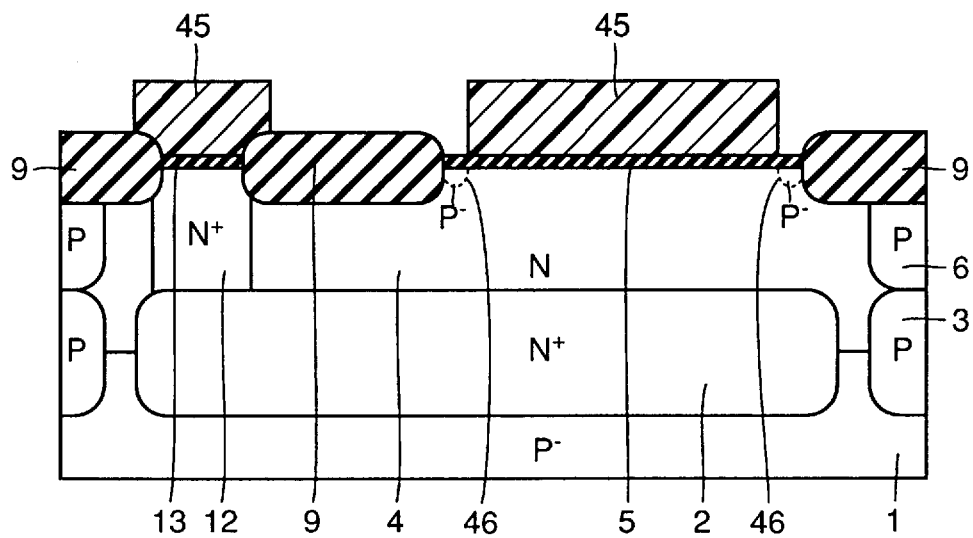
FIGS. 12–14 are cross sectional views of a semiconductor device in the first to third steps of a method of manufacturing the semiconductor device according to a fourth embodiment of the present invention, respectively.

First, conventional steps shown in FIGS. 30–35 are performed. Then, referring to FIG. 12, a nitride film 10 disposed at a region at which a bipolar transistor is formed is removed. A photoresist film 45 is formed which has an opening at an end portion of field oxide film 9. FIG. 12 shows only the portion of the bipolar transistor, and the portion of the MOS transistor according to the fourth embodiment has a structure similar to the conventional example. Photoresist film 45 is formed such that it does not cover the edge portion of field oxide film 9 but covers other diffusion regions of the bipolar transistor, as shown in the figure. Photoresist film 45 is used as a mask and ions are implanted to form a P⁻ layer 46. In order to form a relatively shallow P⁻ layer 46 with a relatively low concentration, ions of such as boron, $BF_2$ or the like are implanted preferably with a range of the amount of ions implanted of $10^{11}$ to $10^{14}$ cm$^{-2}$ and with an acceleration voltage range of 5 to 50 keV.

Figure 13:
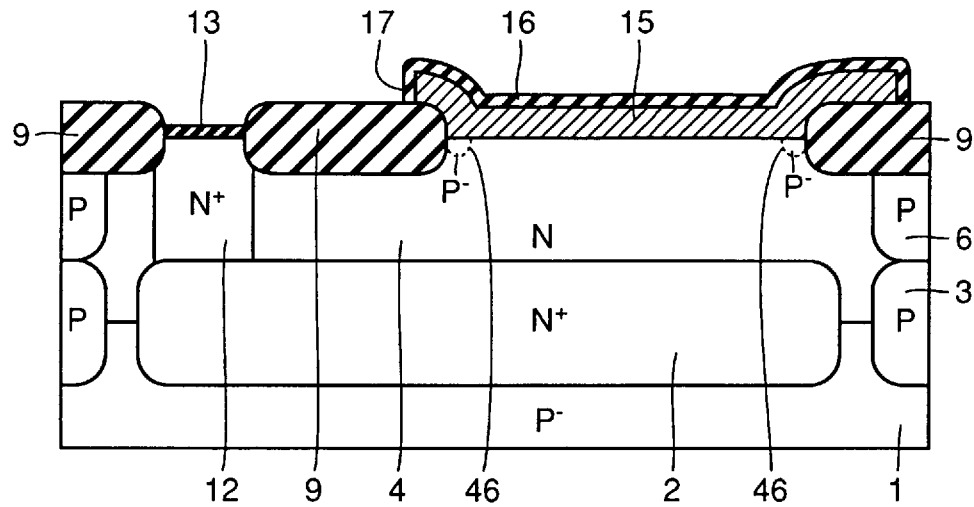

Referring to FIG. 13, a polysilicon layer 15 to which any impurity is not added, and a CVD oxide film 16 are deposited and patterned. A CVD oxide film is deposited and anisotropically etched so that it remains at a sidewall of polysilicon layer 15 as a sidewall spacer 17.

Figure 14:
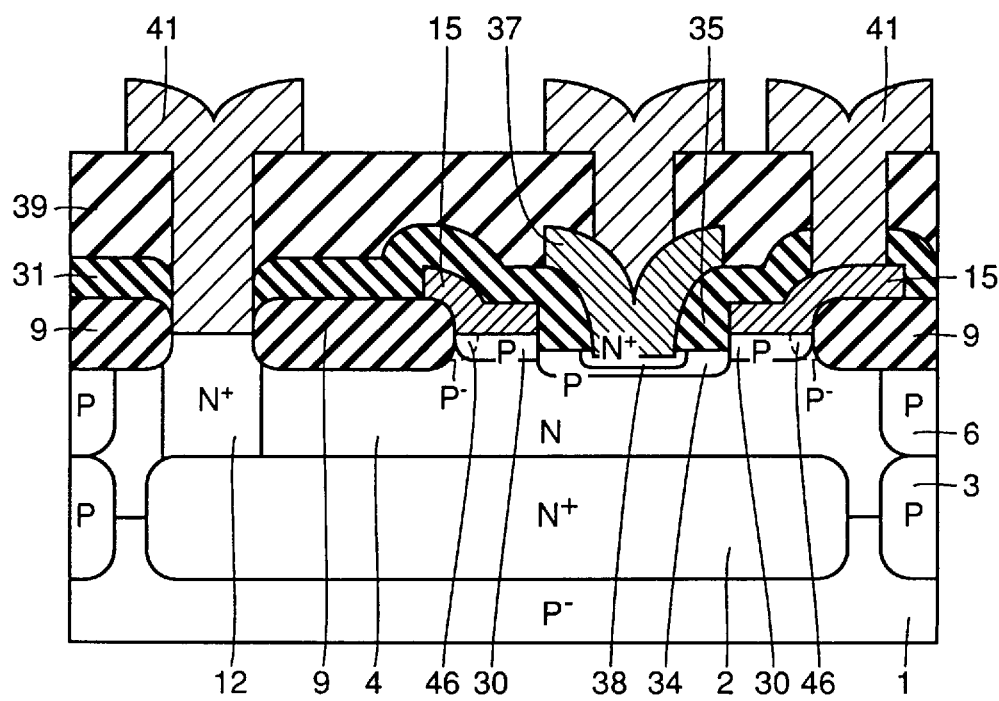

Then, conventional steps (FIGS. 37–43) are performed to obtain the semiconductor device shown in FIG. 14. Since the impurity for P⁻ layer 46 is introduced prior to the introduction of the impurity for P layer 30, the impurity in P⁻ layer 46 is subject to more heat treatment. Thus, although P⁻ layer 46 has a considerably lower concentration than P layer 30, it diffuses almost as deeply as P layer 30.

Referring to FIG. 14, since P⁻ layer 46 is provided which expands along the boundary between an outer wall of external base layer 30 and an end portion of field oxide film 9 and towards the inside of the substrate from a main surface of the semiconductor substrate, the radius of curvature of the PN junction at the edge portion of field oxide film 9 is increased. Furthermore, since the concentration gradient of the P type semiconductor can be reduced so that the breakdown voltage between the collector and the base is improved.

[Fifth Embodiment]

The fifth embodiment relates to another example of the method of forming P⁻ layer 46 in the fourth embodiment. First, conventional steps shown in FIGS. 30–35 are performed. Then, a nitride film 10 is removed.

Figure 15:
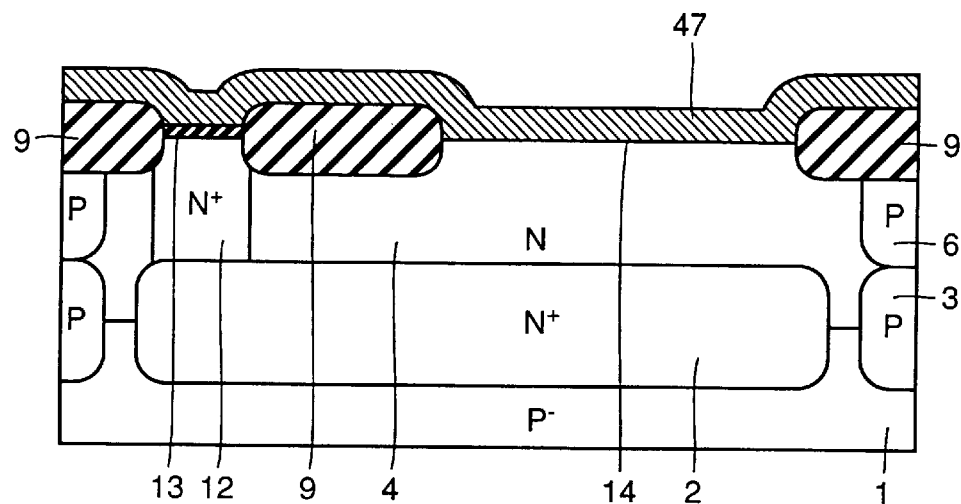
FIGS. 15–17 are cross sectional views of a semiconductor device in the first to third steps of a method of manufacturing the semiconductor device according to a fifth embodiment of the present invention, respectively.

Then, referring to FIG. 15, a CVD film (an oxide film or polysilicon) 47 to which a P type impurity such as boron is added is deposited. FIG. 15 shows only the portion of the bipolar transistor. The portion of the MOS transistor is the same as the conventional example.

A P type impurity is added to CVD film 47 by sending a P type impurity as doping gas during chemical vapor deposition, or by depositing a CVD film to which no impurity is added and then adding a P type impurity to the CVD film by ion implantation or the like.

Figure 16:
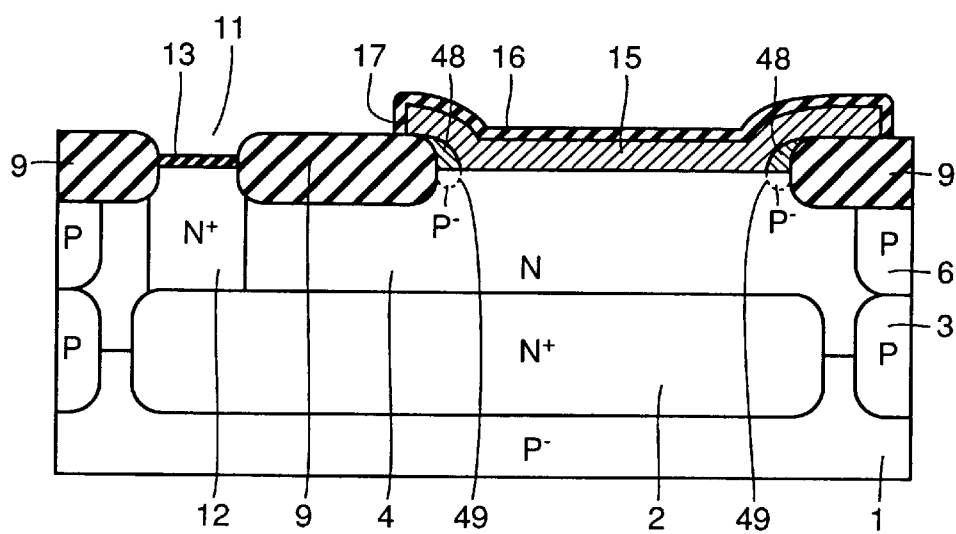
Figure 17:
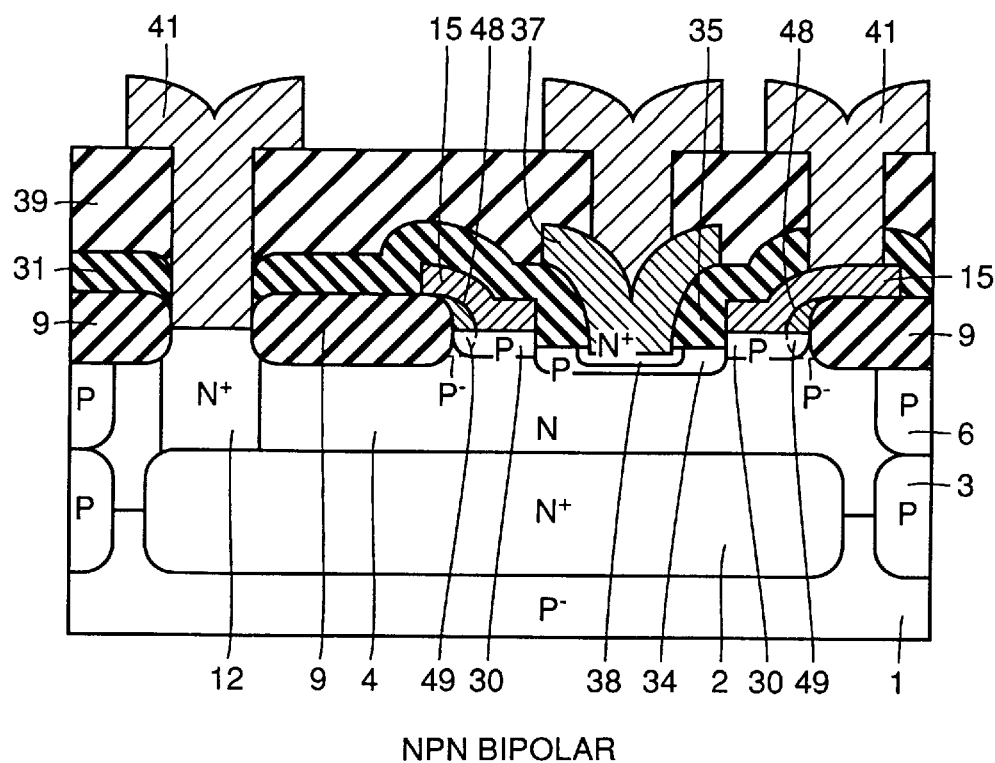

Referring to FIGS. 15 and 16, the entire surface of CVD film 47 is anisotropically etched to form at an inner sidewall of field oxide film 9 a sidewall spacer 48 which contains a P type impurity of high concentration. Although a sidewall spacer is also formed on an inner sidewall of an end portion of field oxide film 9 disposed at a diffusion window 11 for an N type diffusion layer 12 for a collector, it disappears by the subsequent etching of polysilicon layer 15 for the external base and CVD oxide film 17. Polysilicon layer 15 to which no impurity is added and an CVD oxide film 16 are deposited and are patterned so that only that portion of layer 15 and film 17 which covers the base region remains. CVD oxide film 17 is deposited and its entire surface is anisotropically etched to form a sidewall spacer 17. The impurity of sidewall spacer 48 is diffused by the heat generated when CVD films 15, 16 and 17 are deposited, and thus a P⁻ layer 41 is formed. Then, the same steps as conventional steps (FIGS. 37–43) are performed to obtain the semiconductor device shown in FIG. 17.

[Six Embodiment]

First, conventional steps (FIGS. 30–35) are performed. Then, a nitride film 10 disposed at the bipolar transistor region is removed.

Figure 18:
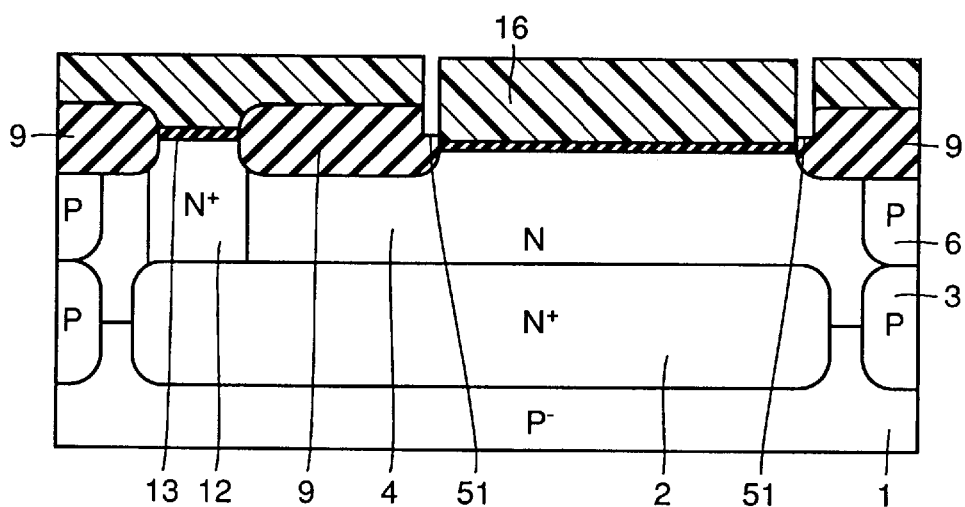
FIGS. 18–20 are cross sectional views of a semiconductor device in the first to third steps of a method of manufacturing the semiconductor device according to a sixth embodiment of the present invention, respectively.
Figure 19:
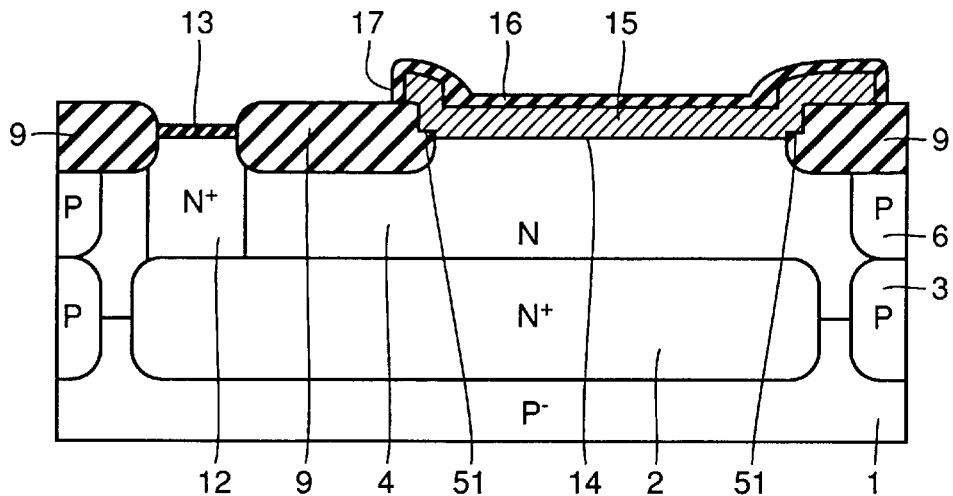

Referring to FIG. 18, a photoresist film 16 is formed which has an opening on that end portion of a field oxide film which is closer to the base region. FIG. 18 shows only the portion of the bipolar transistor. Photoresist film 16 is used as a mask and field oxide film 9 is etched to reduce the thickness of an end portion of field oxide film 9. Then steps similar to conventional steps are performed to obtain the intermediate shown in FIG. 19. Then, conventional steps (FIGS. 37–43) are performed to obtain the semiconductor device shown in FIG. 20.

According to the present embodiment, the thickness of the end portion of field oxide film 19 which is closer to the base region is reduced. Thus, when polysilicon layer 15 for the external base is formed and P layer for the external base is then formed, a P layer (52) for the external base which is diffused more deeply than a conventional layer (30) is obtained at the edge portion of field oxide film 9.

Figure 20:
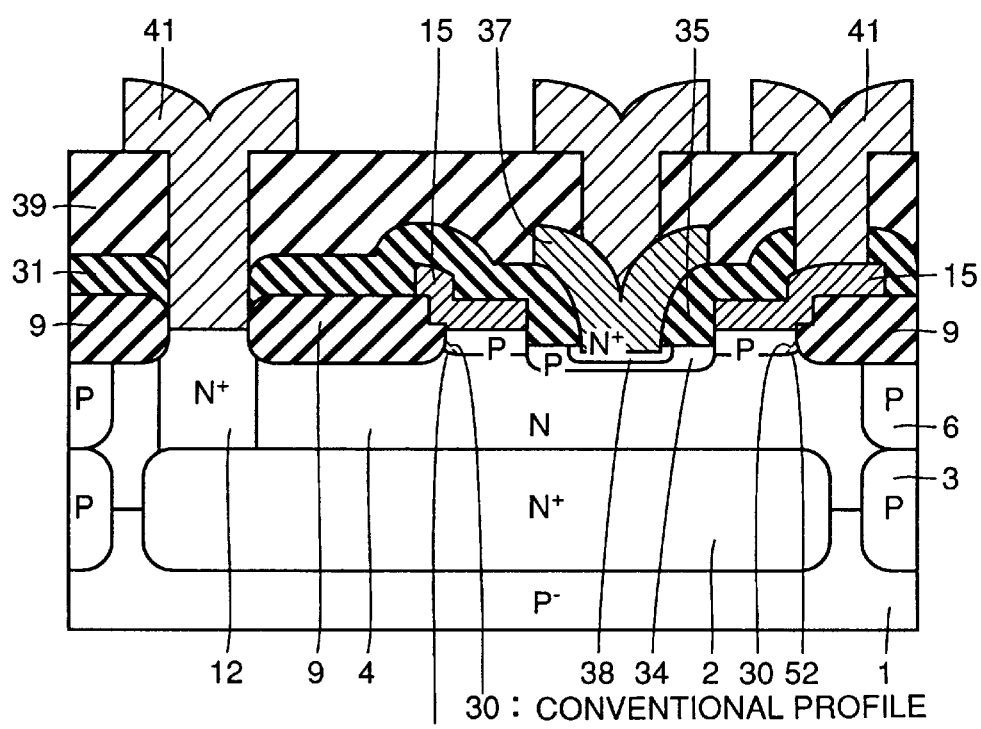

FIG. 20 shows both a profile (52) of an external base layer obtained with the present embodiment and a profile (30) of an external base layer obtained with a conventional method.

Profile (52) allows increased radius of curvature of a PN junction of an N epitaxial layer for a collector and a P layer for an external base disposed at an end portion of field oxide film 9 and therefore allows the electric field concentration to be relaxed when reverse bias is applied between the base and the collector.

[Seventh Embodiment]

Figure 21:
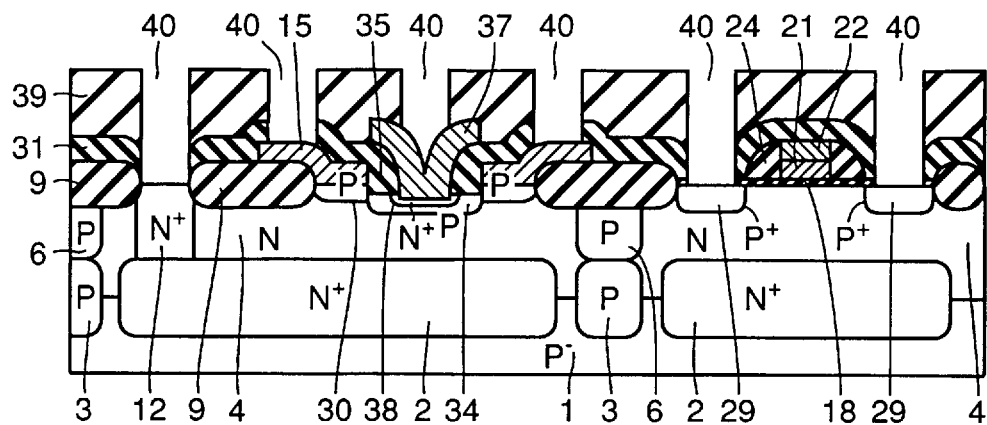
FIGS. 21–23 are cross sectional views of a semiconductor device in the first to third steps of a method of manufacturing the semiconductor device according to a seventh embodiment of the present invention, respectively.
Figure 42:
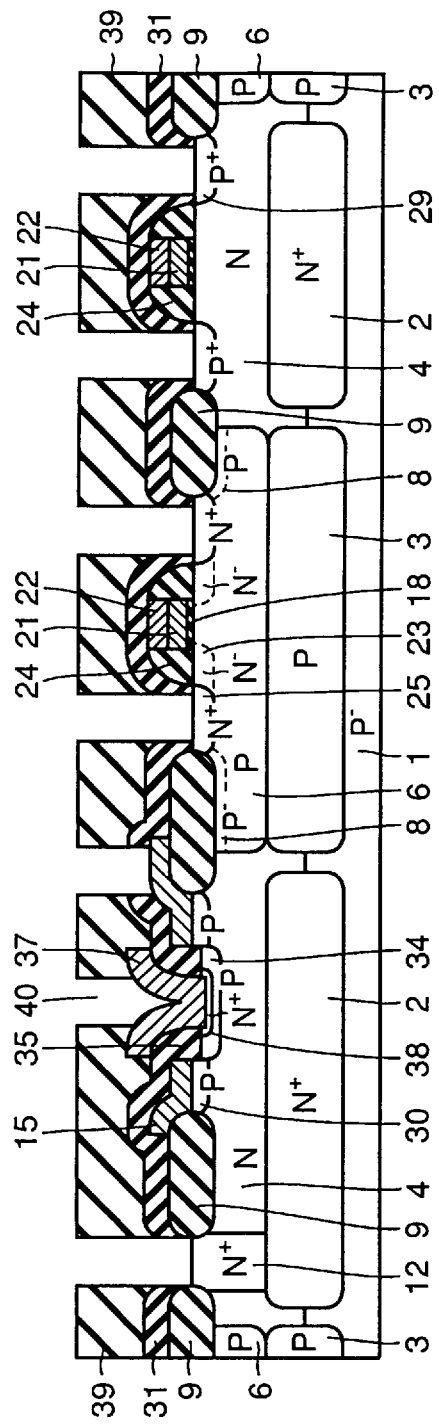
Figure 43:
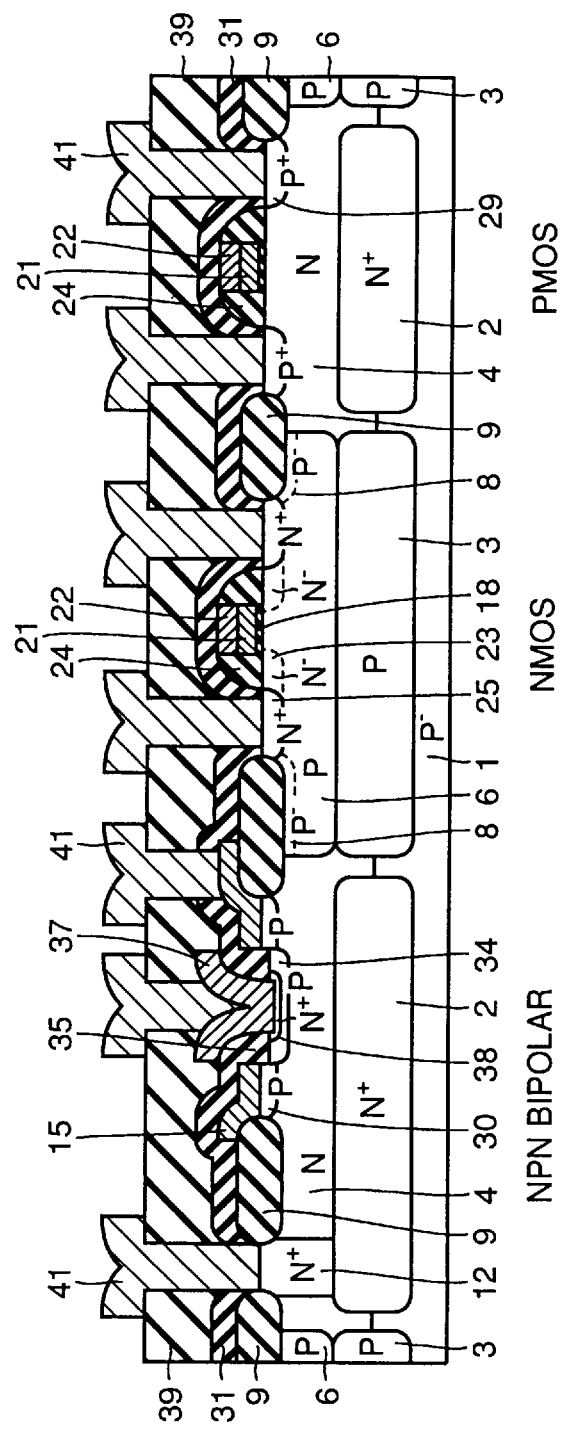

FIG. 21 corresponds to FIG. 42 of a conventional example.

Figure 22:
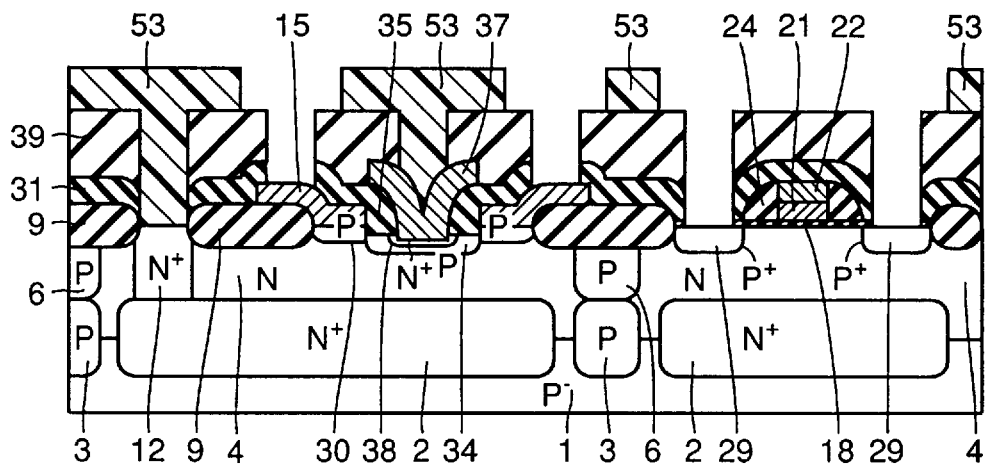

Referring to FIGS. 21 and 22, a photoresist film 53 is formed at the entire surface of a semiconductor substrate 1 and patterned as shown in the figures to cover a contact of an N type diffusion layer 12.

Figure 23:
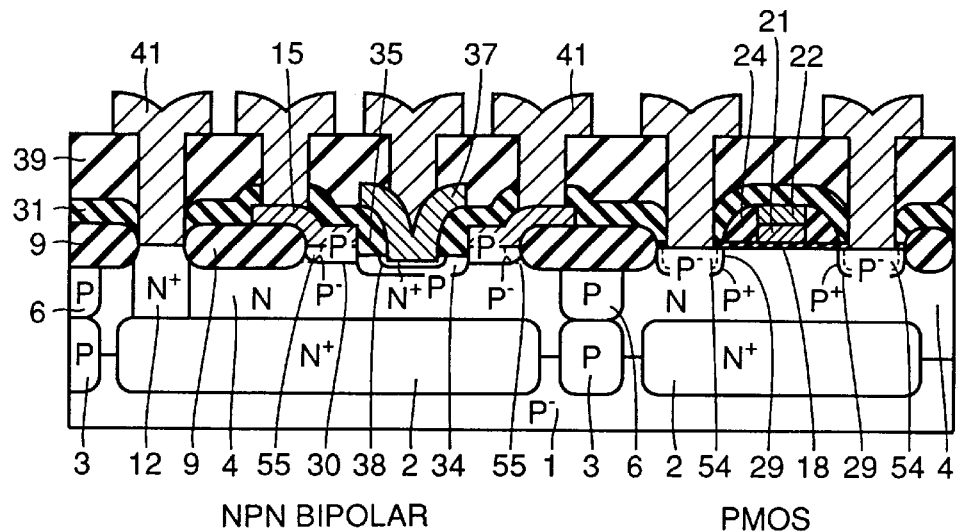

Referring to FIGS. 22 and 23, photoresist film 53 is used as a mask and ions of a P type impurity such as borons and $BF_2$ are implanted to form P⁻ layers 55 and 54 simultaneously. As for ion implanting conditions, the acceleration voltage is preferably 50 to 400 keV and the amount of ion implanted is preferably $10^{12}$ to $10^{15}$ cm$^{-2}$. A metal electrode 41 is formed.

Conventionally, P⁻ layer 54 is introduced into a contact for a P⁺ source/drain region of a PMOS transistor for the purpose of avoiding contact resistance with metal electrode 41. This is also applied to an external base contact of an NPN bipolar transistor to provide P⁻ layer 55 beside diffusion layer 30 for the external base, so that the process can be effectively simplified. Since P⁻ layer 55 is formed after the contact is opened, the base contact must be provided along a field oxide film 9 closer to the base region. Thus, current from the emitter electrode need be led out by a metal interconnection in the second layer.

[Eighth Embodiment]

Figure 30:
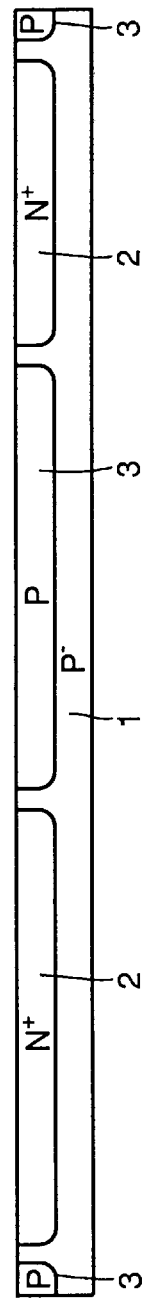
FIGS. 30–43 are cross sectional views of a semiconductor device in the first to fourteenth steps of a method of manufacturing a conventional semiconductor device, respectively.
Figure 31:
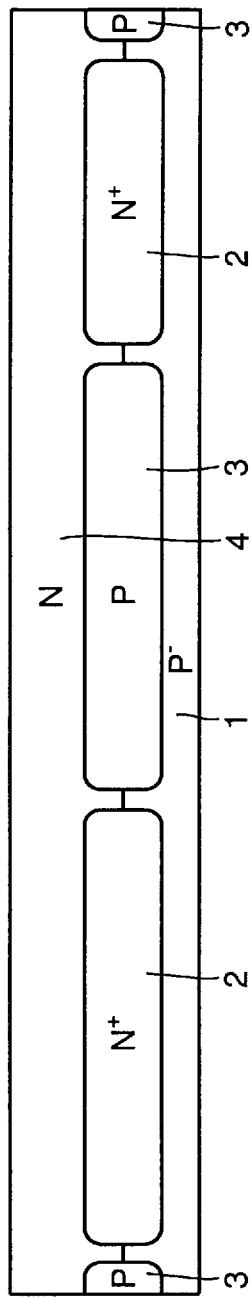
Figure 32:
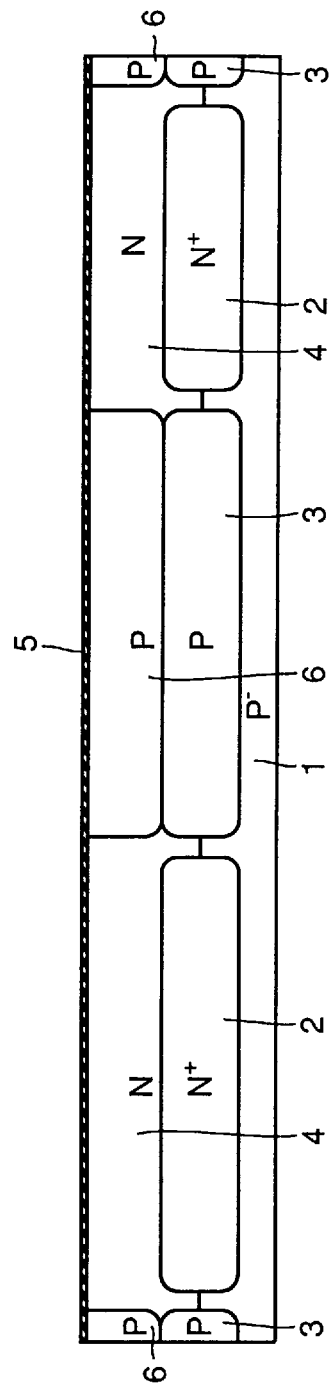
Figure 33:
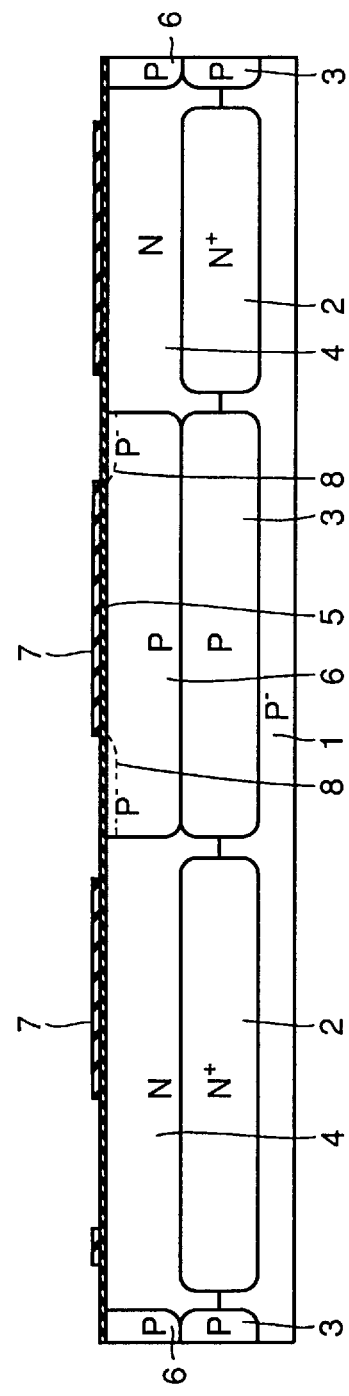
Figure 34:
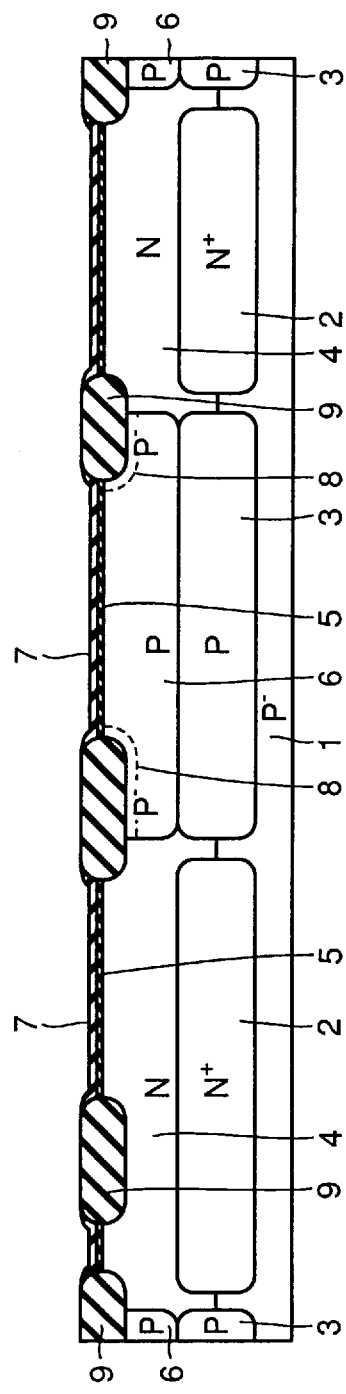
Figure 35:
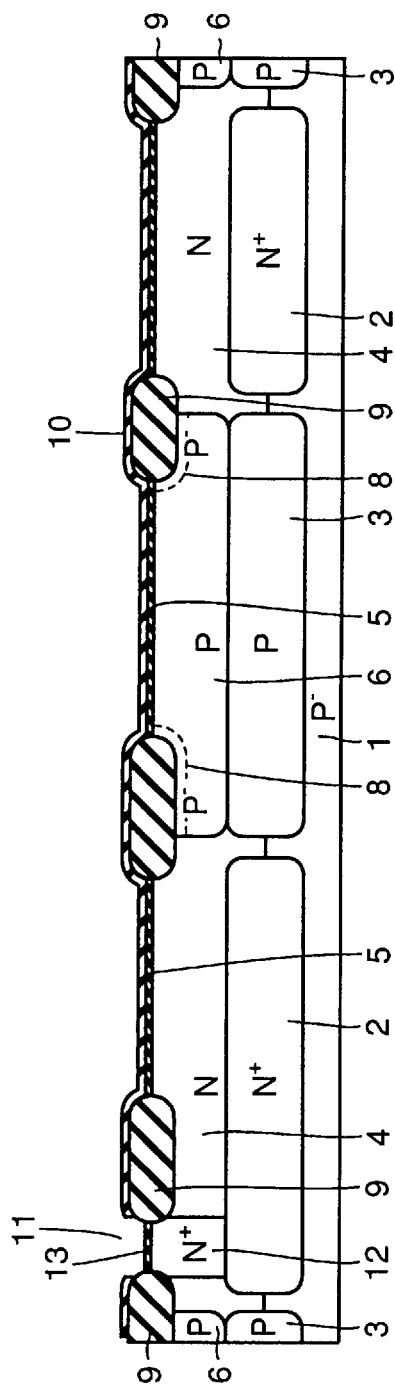
Figure 36:
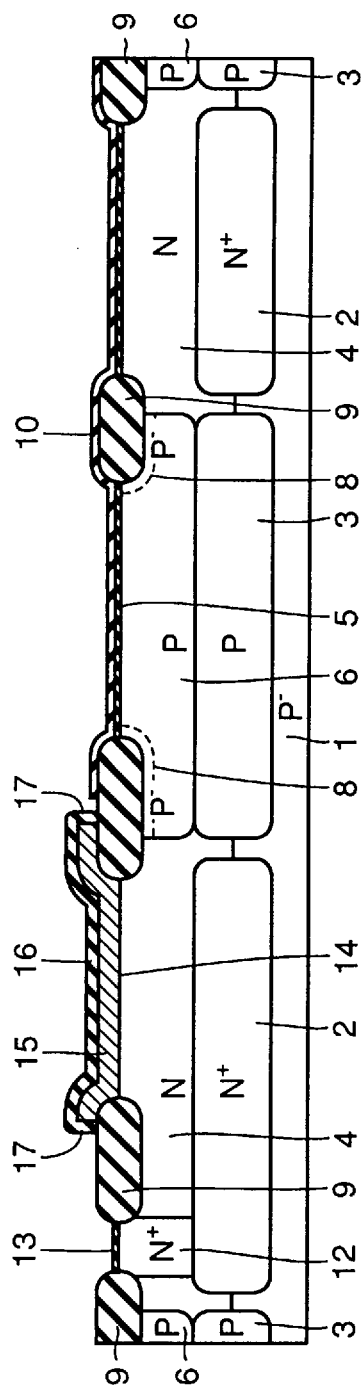

The steps shown in FIGS. 30–32 are performed. Then a nitride film is formed at the entire surface.

Figure 24:
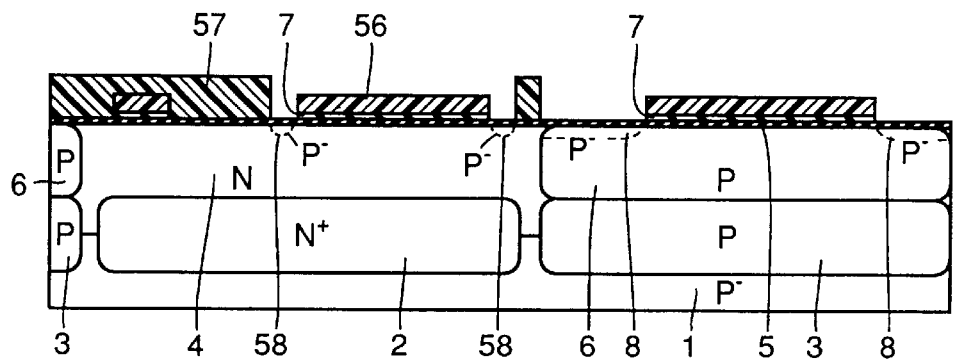
FIGS. 24–26 are cross sectional views of a semiconductor device in the first to third steps of a method of manufacturing the semiconductor device according to an eighth embodiment of the present invention, respectively.

Referring to FIG. 24, a region at which a field oxide film is to be formed is coated with photoresist 56 and a nitride film 7 is patterned. A photoresist film 57 is further applied and patterned to leave photoresist film 57 at a region into which a channel cut P⁻ layer should not be introduced. Photoresist film 57 is used as a mask and ions of a P type impurity such as boron are implanted. As for ion implanting conditions, the acceleration voltage preferably ranges from 10 to 100 keV and the amount of ions to be implanted preferably ranges from $10^{11}$ to $10^{14}$ cm$^{-2}$. P$^-$ layers 58 and 8 are thus formed.

Figure 25:
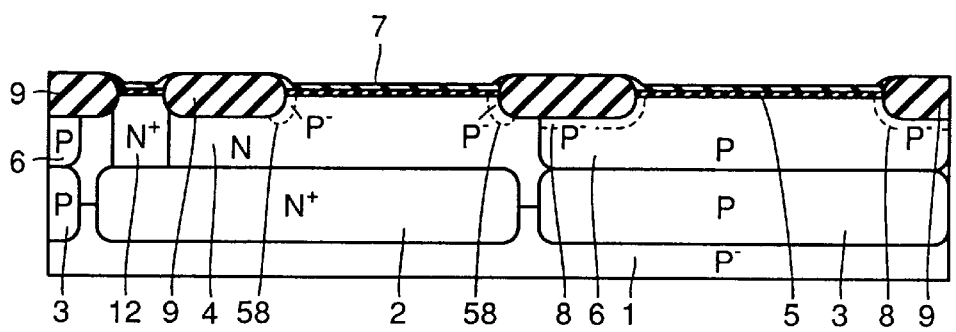

Referring to FIG. 25, after resist films 56 and 57 are removed, a thick film oxide film 9 is formed by thermal oxidation. The heat treatment allow P$^-$ layers 58 and 8 to expand.

Figure 26:
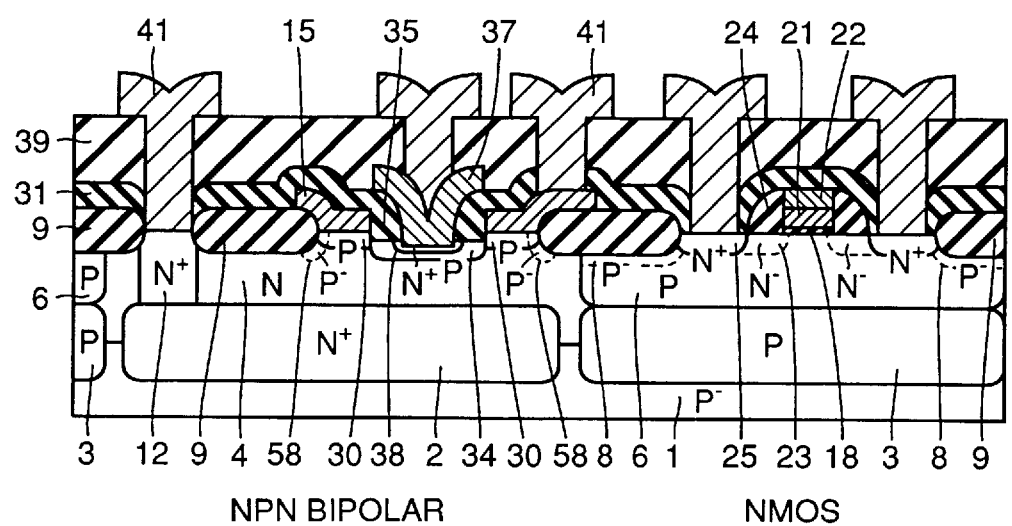

Then conventional steps (FIGS. 34–43) are performed to obtain the semiconductor device shown in FIG. 26.

Although the above embodiments illustrate an example of NPN bipolar, NMOS and PMOS transistors, the conductivity types of all the impurities may be replaced with the opposite conductivity types to form PNP bipolar, PMOS and NMOS transistors to obtain a similar effect.

A semiconductor device according to a first aspect of the present invention is provided with a low concentration impurity diffusion layer which is provided at a main surface of a semiconductor substrate along a boundary between an outer perimeter of an external base layer and an end portion of a field oxide film and which expands from the main surface of the semiconductor substrate towards the inside of the substrate, the low concentration impurity diffusion layer having a concentration lower than that of an impurity for the external base layer. Thus, the radius of curvature of the PN junction at the edge portion of the field oxide film is increased. Accordingly, the electric field strength when the same voltage is applied to the collector and the base is reduced. Furthermore, the breakdown voltage between the collector and the base is effectively improved.

The low concentration impurity diffusion layer may wrap the external base layer to obtain a similar effect.

Furthermore, a field effect transistor of LDD structure having a high concentration source/drain region and a low concentration source/drain region may be provided at the another active region and the low concentration impurity diffusion layer may have the same conductivity type and substantially the same impurity concentration as the low concentration source/drain region to obtain a similar effect.

Furthermore, that end portion of the low concentration source/drain region which is closer to the channel may share a face with sidewall of the gate electrode of the field effect transistor to obtain a similar effect.

Furthermore, that end portion of the low concentration source/drain region which is closer to the channel may be spaced apart from the gate electrode to obtain a similar effect.

A sidewall spacer containing the same conductivity type of impurity as a low concentration impurity diffusion layer may be provided at a sidewall of the above mentioned end portion of the field oxide film to obtain a similar effect.

Furthermore, an external base electrode which is in contact with the external base layer and surrounds the base layer may be provided on the semiconductor substrate and a metal electrode may be provided on the external base electrode such that the metal electrode surrounds the base layer, to obtain a similar effect.

Furthermore, a channel cut layer may be provided exactly under the field oxide film and the low concentration impurity diffusion layer may have the same conductivity type and substantially the same impurity concentration as the channel cut layer to obtain a similar effect.

In a semiconductor device according to a second aspect of the present invention, an end portion of an field oxide film is scraped from a surface thereof downward to provide a step. The presence of a such a step results in a larger radius of curvature of the PN junction at the end portion of the field oxide film. Furthermore, the electric field concentration can be relaxed even when reverse bias is applied between the collector and the base.

In a method of manufacturing a semiconductor device according to a third aspect of the present invention, a low concentration impurity diffusion layer the impurity concentration of which is lower than that of an external base layer is formed at a surface of an active region. The presence of such a low concentration impurity diffusion layer allows an increased radius of curvature of the PN junction disposed at an edge portion of a field oxide film. Therefore, a semiconductor device in which the breakdown voltage between the collector and base is improved can be obtained.

Ion implantation for forming the low concentration impurity diffusion layer may also serve as ion implantation for forming a low concentration source/drain layer of a field effect transistor of LDD structure to obtain a similar effect.

Furthermore, impurity ion implantation for forming a low concentration source/drain layer of a field effect transistor of LDD structure may be performed prior to formation of a sidewall spacer at a sidewall of a gate electrode of the field effect transistor to obtain a similar effect.

Furthermore, impurity ion implantation for forming the low concentration source/drain region of the field effect transistor of LDD structure may be performed after formation of a sidewall spacer at a sidewall of a gate electrode of the electric field transistor to obtain a similar effect.

Furthermore, the low concentration impurity diffusion layer may be formed only near the above mentioned end portion of the field oxide film to obtain a similar effect.

The low concentration impurity diffusion layer may be formed by forming an impurity-containing sidewall spacer at a sidewall of the above mentioned end portion of the field oxide film and by diffusing the impurity contained in the sidewall spacer into a surface of the semiconductor substrate to obtain a similar effect.

In a method of manufacturing a semiconductor device according to a fourth aspect of the present invention, a portion of the surface of an end portion of a field oxide film is scraped off along the peripheral portion of an active region. This allow an increased radius of curvature of the PN junction disposed at the end portion of the field oxide film. Furthermore, a semiconductor device is obtained in which the electric field concentration can be relaxed even when reverse bias is applied between the collector and the base.

In a method of manufacturing a semiconductor device according to a fifth aspect of the present invention, impurity ions having a lower concentration than the impurity concentration of the external base layer and having the same conductivity type as the external base layer are selectively implanted into a boundary between the external base layer and a field oxide film through an external base electrode, to form a low concentration impurity diffusion layer beside an external base diffusion layer. This allows an increased radius of curvature of the PN junction disposed at the end portion of the field oxide film, and a semiconductor device is obtained in which the electric field concentration can be relaxed even when reverse bias is applied between the collector and the base.

In a method of manufacturing a semiconductor device according a sixth aspect of the present invention, a low concentration impurity diffusion layer having the same impurity concentration as a channel cut layer is formed at a boundary between an active region and a region at which a field oxide film is to be formed. This allows an increased radius of curvature of the PN junction at an end portion of the field oxide film. Furthermore, a semiconductor device is obtained in which the electric field concentration can be relaxed even when reverse bias is applied between the collector and the base.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate;

a field oxide film provided at a main surface of said semiconductor substrate to separate an active region from another active region, an end portion of said field oxide film surrounding said active region;

an emitter layer provided at a surface of said active region;

a base layer provided at a surface of said active region and surrounding said emitter layer;

an external base layer provided at a surface of said active region and surrounding a perimeter of said base layer, an inner perimeter of said external base layer being electrically connected to said base layer, an outer perimeter of said external base layer being in contact with said end portion of said field oxide film; and a low concentration impurity diffusion layer provided at a main surface of said semiconductor substrate along a boundary between said outer perimeter of said external base layer and a said end portion of said field oxide film and expanding from the main surface of said semiconductor substrate toward an inside of the substrate, said low concentration impurity diffusion layer having a concentration lower than that of an impurity of said external base layer, wherein said low concentration impurity diffusion layer wraps said external base layer except for the inner perimeter of said external base layer.

2. The semiconductor device according to claim 1, wherein a field effect transistor of LDD structure having a high concentration source/drain region and a low concentration source/drain region is provided at said another active region, and said low concentration impurity diffusion layer has a same conductivity type and substantially a same impurity concentration as said low concentration source/drain region.

3. The semiconductor device according to claim 2, wherein that end portion of said low concentration source/drain region which is closer to a channel shares a face with a sidewall of said gate electrode of said field-effect transistor.

4. The semiconductor device according to claim 2, wherein that end portion of said low concentration source/drain region which is closer to a channel is spaced apart from said gate electrode.

5. Semiconductor device according to claim 1, wherein a sidewall of said end portion of said field oxide film is provided with a sidewall spacer containing an impurity having a same conductivity type as a low concentration impurity diffusion layer.

6. The semiconductor device according to claim 1, comprising:

an external base electrode provided on said semiconductor substrate, said external base electrode being in contact with and surrounding said external base layer; and a metal electrode provided on said external base electrode and surrounding said base layer.

7. The semiconductor device according to claim 1, wherein a channel cut layer is provided exactly under said field oxide film, and said low concentration impurity diffusion layer has a same conductivity type and substantially a same impurity concentration as said channel cut layer.

8. A semiconductor device comprising:

a semiconductor substrate;

a field oxide film provided at a main surface of said semiconductor substrate to separate an active region from another active region, an end portion of said field oxide film surrounding said active region;

an emitter layer provided at a surface of said active region;

a base layer provided at a surface of said active region and surrounding said emitter layer; and an external base electrode provided at a surface of said active region and surrounding a perimeter of said base layer, an inner perimeter of said external base electrode being electrically connected to said base layer, an outer perimeter of said external base electrode being in contact with said end portion of said field oxide film; wherein said end portion of said field oxide film is scraped at a surface thereof downward to provide a step.

* * * * *